United States Patent [19]

Shannon

[11] 3,841,917

[45] Oct. 15, 1974

[54] METHODS OF MANUFACTURING SEMICONDUCTOR DEVICES

[75] Inventor: John Martin Shannon, Salfords, England

[73] Assignee: U.S. Philips Corporation, New York, N.Y.

[22] Filed: Aug. 31, 1972

[21] Appl. No.: 285,456

[30] Foreign Application Priority Data

Sept. 6, 1971 Great Britain .................... 41462/71

[52] U.S. Cl. .................... 148/1.5, 148/191, 317/235

[51] Int. Cl. .............................................. H01l 7/54

[58] Field of Search ...... 148/1.5 C–1.5 P, DIG. 191; 317/235 CP

[56] References Cited

UNITED STATES PATENTS

| | | | |
|---|---|---|---|
| 3,298,880 | 1/1967 | Takagi et al. | 148/191 |
| 3,560,277 | 2/1971 | Lloyd et al. | 148/191 X |
| 3,622,382 | 11/1971 | Brack et al. | 148/1.5 X |
| 3,655,457 | 4/1972 | Duffy et al. | 148/1.5 |
| 3,718,502 | 2/1973 | Gibbons | 148/191 X |
| 3,734,787 | 5/1973 | Dhaka et al. | 148/191 X |

OTHER PUBLICATIONS

"Radiation Enhanced Diffusion of Boron in Silicon," Nelson et al., App. Phy. Let. Vol. 15, No. 8, Oct. 15, 1969, pp. 246–248.

"Implantation and Annealing Behavior–Studied by the Channeling Tech." Eriksson et al., J. Appl. Phy. Vol. 40, No. 2, February 1969, pp. 842–854.

*Primary Examiner*—Hyland Bizot
*Assistant Examiner*—J. M. Davis
*Attorney, Agent, or Firm*—Frank R. Trifari; Jack Oisher

[57] ABSTRACT

A method of manufacturing a semiconductor device, in which in a semiconductor body comprising a boundary between a higher doped region and a lower doped region radiation enhanced diffusion of impurity is effected across the boundary from the higher doped region into the lower doped region to form in the lower doped region a further region the lateral extent of which is substantially constant, said radiation enhanced diffusion being effected by directing a beam of energetic particles towards the boundary from the side thereof at which the lower doped region is present and to produce damage of the crystal structure in the lower doped region at least in the vicinity of the boundary, the orientation of the semiconductor body with respect to the incident beam and the energy of the particles being selected so as to produce channelling of the semiconductor body crystal lattice by the particles with a channelling range in the lower doped region which extends at least to the boundary. The method may be carried out with proton bombardment and particularly some novel junction field effect transistor structures are formed having channel portions of precisely controlled dimensions. The method may be used in the manufacture of a buried channel junction FET having a uniform pinch-off voltage for all parts of the channel. Also the method may be used to yield junction FET structures in which the output characteristics can be predetermined according to the cross-sectional shape of the channel region portions determined by the bombardment induced radiation enhanced diffusion with controlled channelling.

15 Claims, 9 Drawing Figures

METHODS OF MANUFACTURING SEMICONDUCTOR DEVICES

This invention relates to methods of manufacturing semiconductor devices and to semiconductor devices manufactured by such methods.

In our copending patent application Ser. No. 144,009, filed May 17, 1971, now U.S. Pat. No. 3,761,319, there is described a method of manufacturing a semiconductor device wherein a semiconductor body comprising a boundary between a higher doped region and a lower doped region is subjected to bombardment with accelerated particles which are directed towards the boundary from the side thereof at which the lower doped region is present, the bombardment being effected to cause internal damage of the crystal structure in the vicinity of the boundary, and the semiconductor body being maintained at an elevated temperature during said bombardment to produce an enhanced diffusion of impurity across the boundary from the higher doped region into the lower doped region. This method may be used to form various structures and in the specification of said copending patent application there is disclosed by way of example the use of the method in the manufacture of a bipolar transistor by profiling the impurity concentration in the collector region immediately under the emitter region. Various possibilities are disclosed for the conditions of bombardment and a preferred method of forming the damage to the crystal structure is by bombardment with high energy protons. The specification further refers to a form of the method in which the incidence of the bombarding particles on the semiconductor body is such as to produce channelling through the crystal lattice by said particles or ions.

The present invention concerns an improvement wherein by the use of channelling and by its appropriate control the enhanced impurity diffusion may be effected to produce a region having a substantially constant lateral dimension and thus to yield device structures including such a region, particularly but not exclusively some junction field effect transistor (JFET) structures.

Figure 1:
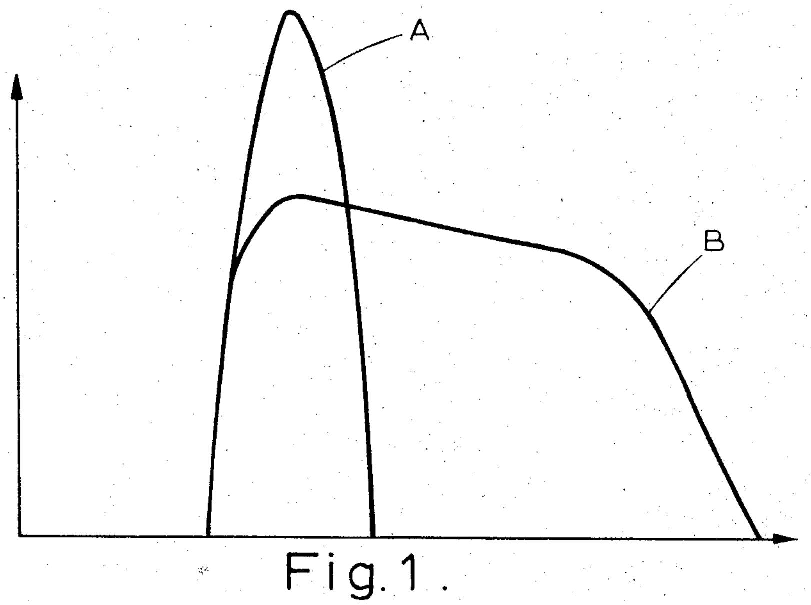

Initially some of the basic mechanisms of bombardment induced impurity diffusion will be considered. FIG. 1 of the drawings schematically shows two distribution curves of high energy protons in a semiconductor body the surface of which is bombarded with said protons. The concentration of protons is plotted as the ordinate on a logarithmic scale and the distance *d* from the surface as abscissa. The line A relates to the case when protons are implanted into an amorphous substrate and is a good approximation to the distribution following an implant in a direction not coinciding with a major crystallographic axis when implanting into a single crystal substrate, hereinafter referred to as a random implant. The distribution of protons is Gaussian and the spread in range being related to ion straggling. Furthermore scattering of the ions during random collision sequences gives rise to lateral or sideways straggling. The line B relates to the case when the surface is bombarded with protons of the same energy but which are incident in a direction corresponding with a major crystallographic axis so as to produce channelling through the crystal lattice. It is seen that with the channelled protons the penetration depth is far greater for the same energy. Energy loss of channelled ions is due to electronic excitation which causes no structural damage. Towards the end of the channelled range the proton will have lost most of its energy and a dechannelling collision sequence will cause much less lateral spread than a corresponding random implant at the same depth.

In the above described method of bombardment induced impurity diffusion across a boundary from a higher doped region into a lower doped region, when it is desired to produce a localised diffusion across the boundary to form a local region of the diffused impurity, the sideways spread of the particles or ions is most relevant to the lateral extent of such a local region. For example if a portion of the surface of the lower doped region is subjected to bombardment with a beam of particles directed perpendicular to the surface but randomly orientated with respect to a major crystallographic axis, the particles being incident on said surface portion through an aperture in a mask, then the enhanced diffusion across the boundary from the higher doped region into the lower doped region may be into an adjoining portion of the lower doped region, the lateral extent of which, and of the resultant diffused region so formed, is greater than the corresponding dimension of the aperture and furthermore varies considerably throughout the thickness of the lower doped region. This is because with the randomly orientated beam which produces random collisions and sideways scattering the resultant area of crystal structure damage has a lateral extent which is greater than the corresponding area of the aperture and is very depth dependent.

It has now been recognised that the sideways spread of the particles is controlled by (a) the diffusion length of the damage species and (b) the straggling of the ion range. It has been found that the vacancy diffusion lengths of the damaged species may be very small, for example less than 0.1 micron and the sideways straggling of ion range can be the major factor influencing the sideways or lateral diffusion. One possible means of avoiding this would be to reduce the energy of the incident beam but this would necessitate the use of a much thinner lower doped region to produce the enhanced impurity diffusion therein across the boundary from the higher doped region. The improvement concerned in this invention is based on the recognition that to achieve the desired region of controlled lateral dimensions, the straggling of ion range is reduced to a negligible factor by using channelling under appropriate conditions. The lateral spread is then determined only by the diffusion length of the damage species.

According to the invention in a method of manufacturing a semiconductor device, in a semiconductor body comprising a boundary between a higher doped region and a lower doped region radiation enhanced diffusion of impurity is effected across the boundary from the higher doped region into the lower doped region to form in the lower doped region a further region the lateral extent of which is substantially constant, said radiation enhanced diffusion being effected by directing a beam of energetic particles towards the boundary from the side thereof at which the lower doped region is present and to produce damage of the crystal structure in the lower doped region at least in the vicinity of the boundary, the orientation of the semiconductor body with respect to the incident beam and the energy of the particles being selected so as to produce channelling of the semiconductor body crystal lattice by the particles with a channelling range in the lower doped region which extends at least to the boundary.

In this method by the use of channelling of the particles with the said range the lateral displacement of a channelled particle may be less than 10 A in a direction normal to the incidence of the beam and provided the energy of the channelled particles is low when they make a collision and become de-channelled the sideways spread is negligible and the lateral extent of the further region determined by the enhanced impurity diffusion becomes substantially entirely determined by the diffusion length of the damage species. Furthermore to produce channelling of the crystal lattice and having the said range, the particle energy may be considerably less than, for example at least one half, the energy required to produce damage in the vicinity of the boundary by a randomly orientated beam. As already described with reference to FIG. 1 of the drawings the line B shows the absorption characteristic of protons which are introduced into the crystal lattice by channelling, the beam being orientated according to a direction corresponding with a major crystallographic axis. It is seen that for the same particle energy the penetration depth is much greater and the distribution over the channelled range more uniform in the case of the channelled protons than in the case of the randomly orientated proton beam. In the channelled case the damage rate is much more uniform along the length of the channelled range compared with the damage resultant from an implant away from a major crystallographic axis which has a peak rate on the surface adjacent side of the peak of the proton distribution. The energy required to channel a particle to the boundary may be reduced to a value of approximately 50 percent of the energy required when using a random implant with a mean range lying in the vicinity of the boundary. For example, to provide a mean range of protons of 3 microns in a lower doped silicon layer of 3 microns thickness on a higher doped silicon substrate the energy required when using a random implant would be approximately 500 KeV whereas for channelled protons having a range of 3 microns the energy required would only be approximately 150 KeV. Thus in the method in accordance with the invention in addition to providing the said further region of precisely controlled lateral dimensions the possibility exists of considerably reducing the energy required for the incident particles and therefore a certain simplicity of the apparatus required for the bombardment is obtained.

In a method in accordance with the invention when the channelling range of the particles does not extend appreciably beyond the boundary then the amount of energy dissipated in the vicinity of the boundary when a particle becomes de-channelled is very small. When the particle makes a collision cascade then it will dissipate only a low amount of energy. Under these conditions the straggling is negligible and each collision cascade forms a localised damage region which effectively changes the lattice temperature. It is well known that de-channelling takes place over the entire length of the channelled range. Thus damage is generated and the effective lattice temperature is increased along the path of the channelled particles or ions. The sideways spread of the enhanced impurity diffusion is now substantially only dependent on the diffusion of the damage species.

In a preferred form of the method the energy of the particles is selected such that the channelling range of the particles does not extend substantially beyond the boundary. In this manner any straggling of the de-channelled particles will be very small in the vicinity of the boundary because at the end of the channelling range of the particles only a small amount of energy is dissipated on de-channelling. However in certain cases the use of particles having a channelling range which theoretically extends a short distance beyond the boundary can be tolerated. This is so when the boundary corresponds substantially with an epitaxial layer/-substrate interface where due to the crystal lattice mismatch at the interface appreciable de-channelling will occur at the interface therefore enhancing diffusion in this locality.

In one form of the method the channelling of particles is effected to produce damage of the crystal structure throughout the length of the lower doped region traversed by said particles whereby the further region of substantially constant lateral dimensions formed by the enhanced diffusion extends between the boundary and a surface of the lower doped region remote from the boundary.

Preferably the lower doped region extends to a surface of the semiconductor body remote from the boundary and the particles are incident on said surface. However, the method may also be employed in the case where the lower doped region is a buried region and the channelled particles traverse the lower doped region.

The energy of the particles or ions may be varied during the bombardment. Thus, for example, where it is desired to effect enhanced impurity diffusion from the highly doped region into the lower doped region so that the further region of substantially constant lateral dimensions extends to the surface or close to the surface of the lower doped region the particle energy initially may be selected so that the channelling range in the lower doped region extends substantially to the boundary and thereafter the energy is reduced so that the channelling range in the lower doped region shifts towards the surface of the lower doped region.

Various possibilities exist for the choice of particles but in a preferred form of the method protons are used for the bombardment. Other particles which may be used, for example, are electrons, helium ions, or ions which act as donor or acceptor impurities in the semiconductor body, although in many instances proton bombardment will be preferred because it is the lightest ion and therefore has the longest range for a given energy. When impurity ions are used, in addition to causing the desired internal damage of the crystal structure these may also serve to determine the conductivity and/or conductivity type of a region of the semiconductor body.

The temperature at which the semiconductor body is maintained during bombardment will be determined by the kinetics of diffusion in the particular semiconductor material, for example with some semiconductor materials no external source of heat may be required. When using proton bombardment, for example for silicon, it will be necessary to heat the semiconductor body, for example at temperatures in the range of 700° to 900°C using an external heating source.

In a method in accordance with the invention the higher doped region and the lower doped region may be of the same conductivity type or of different conductivity types.

The boundary may substantially coincide with the interface between a substrate region of the body and an epitaxial layer thereon. The higher doped region may lie mainly in the substrate region and the lower doped region in the epitaxial layer. The higher doped region may consist of a buried layer extending into the substrate region from the surface thereof on which the epitaxial layer is present.

In a preferred form of the method the incidence of the particles on the semiconductor body at the side of the boundary at which the lower doped region is present is localised so that the enhanced impurity diffusion from the higher doped region into the lower doped region is produced across only a part of the area of the boundary. The bombardment may be effected in the presence of a mask at the semiconductor body surface, the enhanced impurity diffusion being produced across part of the area of the boundary determined by an opening in the mask.

In one form of the method the incident beam of particles is normal to the surface of the lower doped region, the crystallographic orientation of the body being such as to yield channelling in this direction of the incident beam. Thus for example, with a silicon semiconductor body particles are channelled in the <111> direction with a beam normal to the surface of the lower doped region when the plane of the surface of the lower doped region lies normal to the <111> direction.

In another form of the method the incident beam of particles or ions inclined to the surface of the lower doped region. Thus, for example, in a silicon semiconductor body in which the surface of the lower doped region lies normal to the <111> direction, the particles or ions may be channelled in the <110> direction by using such an inclined beam and accurately aligned to the <110> direction.

The method may be used in the manufacture of various devices, for example in the manufacture of a bipolar transistor, wherein the enhanced impurity diffusion is effected to determine the extent and doping of a part of the collector region situated directly below the emitter region.

However, the method may also be employed with considerable advantage in the manufacture of a junction field effect transistor (JFET). In this form of the method the enhanced impurity diffusion may be effected to determine in an epitaxial layer of one conductivity type gate region wall portions of the opposite conductivity type formed by enhanced diffusion of impurity from one or more buried layers of higher doping and of the opposite conductivity type extending at the substrate surface on which the epitaxial layer is present, said gate region wall portions having a substantially constant separation and so determining a channel region of the one conductivity type in the epitaxial layer, said channel region being of substantially constant thickness.

In one specific form of such a method of forming a junction field effect transistor the substrate is of the one conductivity type and comprises a plurality of spaced highly doped buried regions of the opposite conductivity type, the current flow between source and drain electrodes on the channel region being in the direction across the epitaxial layer in a portion or portions of the epitaxial layer of substantially constant width determined by the gate wall portions formed in said layer by enhanced diffusion from the said buried regions. In this JFET in which the current flow extends between the surface of the lower doped region and the substrate surface and the thickness of the channel is determined by the substantially constant separation of the gate region wall portions the pinch-off voltage may be substantially constant throughout the entire channel length. The substrate constitutes one of the two electrodes forming the source and drain, and in this device the resistance in series with the channel can be made very low.

Also, the device may be constructed such that the channel region portion or portions of the one conductivity type are laterally surrounded on all sides by the gate wall portions of the opposite conductivity type and thus the channel can be depleted from all sides. Therefore by appropriate choice of the cross-sectional area of the channel region portion or portions the output characteristics of the device can be predetermined.

In another specific form of the method in which a JFET is formed the epitaxial layer is present on a substrate which is of the one conductivity type and comprises at the surface thereof a single highly doped buried region of the opposite conductivity type, the current flow in the channel region between source and drain electrodes on the surface of the epitaxial layer being in a direction substantially parallel to the surface of the epitaxial layer in portions of the epitaxial layer of substantially constant width and determined by the gate wall portions formed in said layer by enhanced diffusion from spaced portions of the highly doped buried region. Preferably in this device at the surface of the eptiaxial layer there is formed a further layer of the opposite conductivity type which connects adjoining gate wall portions. In this device in which the current flow in the channel portions of substantially constant thickness is substantially entirely parallel to the surface of the epitaxial layer similar advantages arise in respect of the pinch-off voltage variation control. In said device comprising the further layer of the opposite conductivity type which connects adjoining gate wall portions the further advantage arises that the channel is at least partly buried and there surrounded on all sides by the gate region which is constituted by the buried region of the opposite conductivity type, the gate wall portions formed by enhanced diffusion and the further layer of the opposite conductivity type. In such a device the current flow in the channel may be pinched-off from all sides so that just prior to the pinch-off condition the current flows in a small area central portion of the channel. This structure may have a high gain and a low gate capacitance. Furthermore by providing a small substantially constant separation of the gate wall portions a JFET which is normally off at zero gate bias can be formed on further appropriate choice of the doping of the epitaxial layer.

Figure 2:
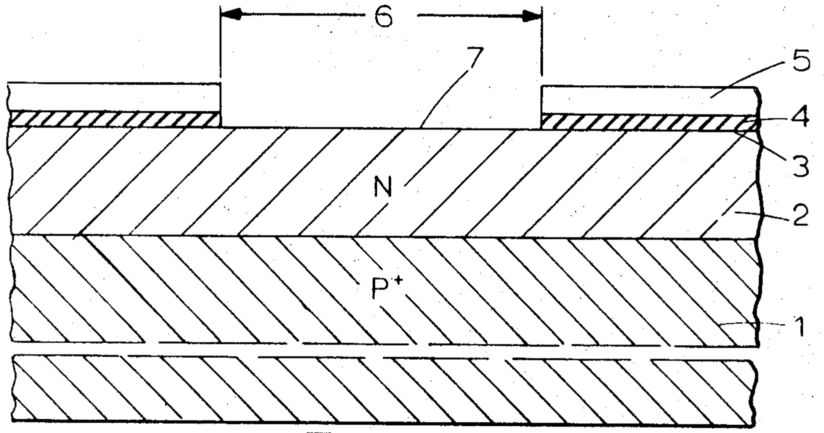
Figure 3:
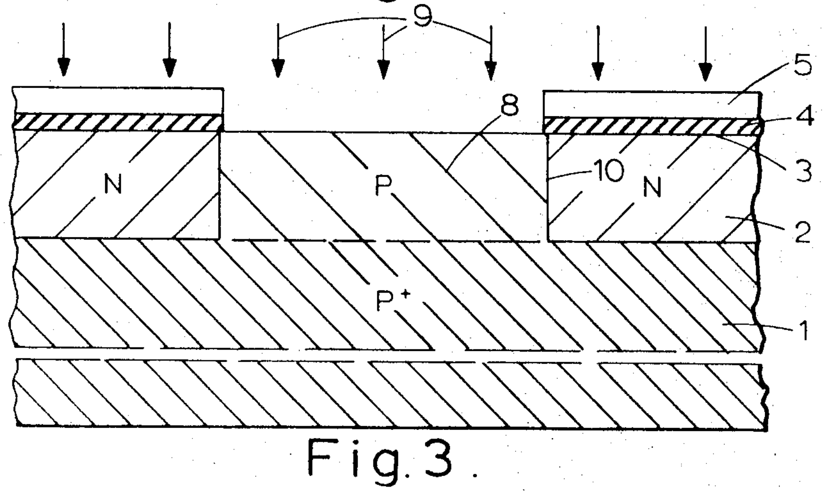
Figure 4:
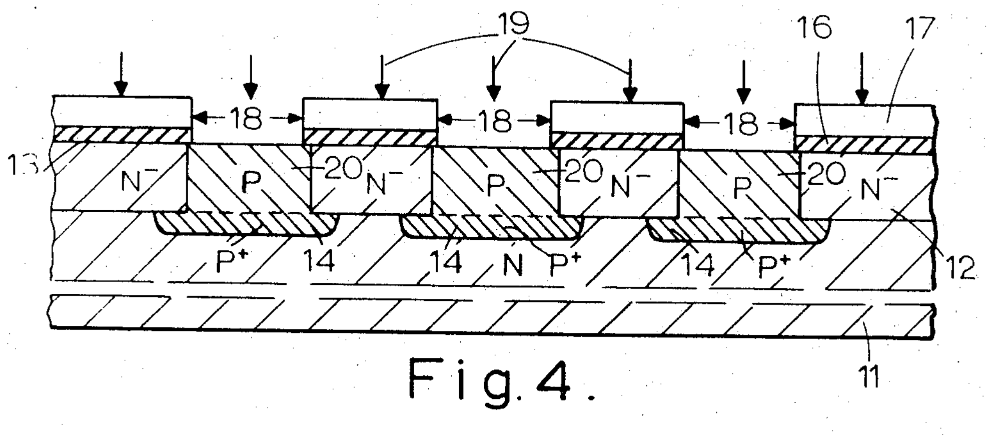
Figure 5:
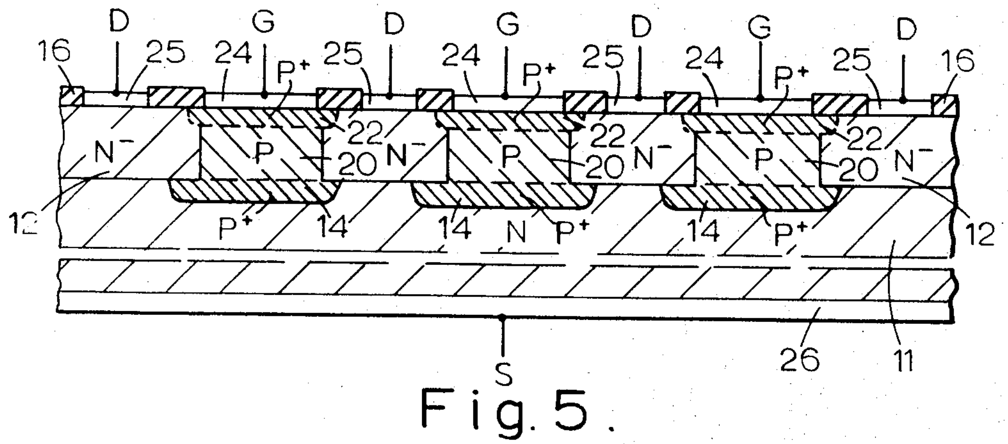
Figure 6:
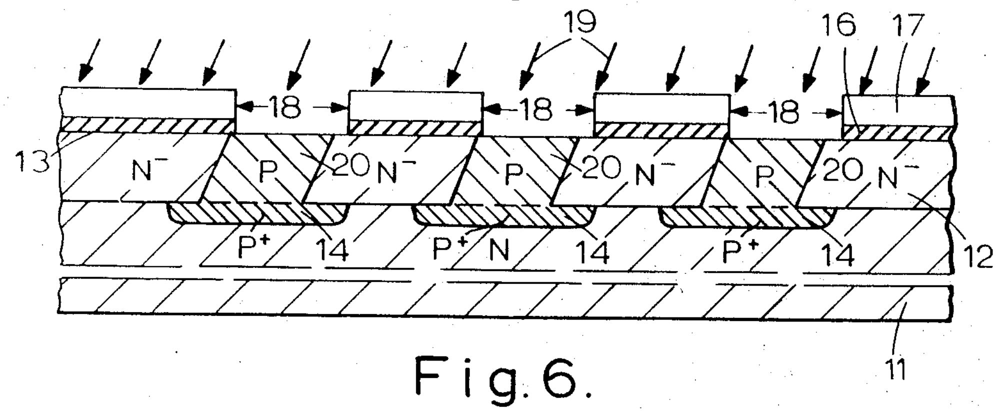
Figures 7, 8, 9:
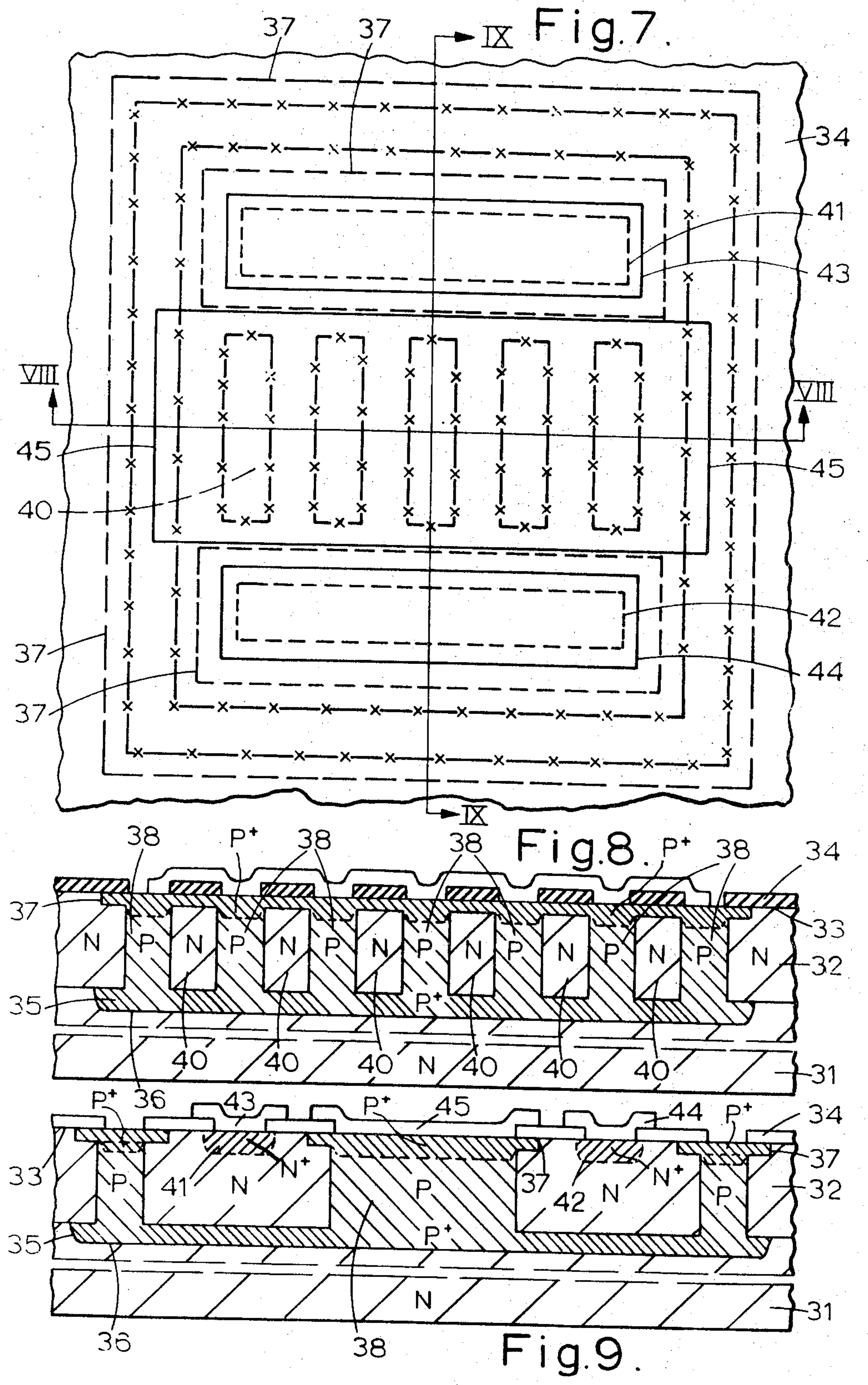

Embodiments of the invention will now be described, by way of example, with reference to FIGS. 2 to 9 of the diagrammatic drawings in which:

FIGS. 2 and 3 are cross sectional views of a semiconductor body during successive stages of a first embodiment of a method in accordance with the invention, this being a generalised embodiment and serving to illustrate bombardment induced enhanced impurity diffusion across a boundary with controlled channelling to produce a region having a substantially constant lateral extent, FIGS. 4 and 5 are cross-sectional views of the semiconductor body during various stages of a second embodiment, FIG. 6 is a cross-sectional view of the semiconductor body at a stage in the method of a third embodiment, FIG. 7 is a plan view of part of the semiconductor body of a junction field effect transistor manufactured with the aid of the method in accordance with the invention, and FIGS. 8 and 9 are cross-sectional views taken on the lines VIII—VIII and VIIII—VIIII respectively of FIG. 7.

Referring now to FIGS. 2 and 3, on a boron doped $p^+$-silicon substrate 1 of 0.001 ohm.cm resistivity and approximately 200 microns thickness there is epitaxially deposited a lower doped n-type epitaxial layer 2 of 5 ohm.cm resistivity containing phosphorus as the donor dopant and having a thickness of 3 microns. The phosphorus doping in the epitaxial layer is substantially uniform and has a value of approximately $10^{15}$ atoms/cm$^3$. The planes of the surface of the substrate and epitaxial layer lie normal to the <111> direction. On the surface 3 of the epitaxial layer there is grown a layer of silicon oxide 4 of 1,200 Å thickness by oxidation in wet oxygen at an elevated temperature. After oxidation a molybdenum layer 5 of approximately 1 micron thickness is deposited on the silicon oxide layer 4. By a photoprocessing and etching step an opening 6 is made in the molybdenum layer 5 and the underlying silicon oxide layer 4 to expose a surface portion 7 of the epitaxial layer.

The semiconductor body is then placed in the target chamber of a proton accelerator apparatus with the surface 7 lying normal to the beam axis which therefore is aligned with the <111> direction. Proton bombardment is effected while heating the semiconductor body at 800°C. Protons enter the crystal lattice through the opening 6 in the masking layers 4, 5 and move along open channels in the <111> direction of the crystal lattice, the initial energy being chosen such that the channelled range of the protons is approximately 3.2 microns and thus substantially coinciding with the epitaxial layer/substrate interface. The lateral deviation of the channelled protons is very small. At the end of the channelled range of the protons the amount of energy released on de-channelling is small and the sideways spread of the protons is negligible. The protons create damage of the crystal lattice in an area which coincides substantially with the area of the opening 6. At the heating temperature of 800°C boron atoms in the higher doped substrate 1 diffuse across the boundary into the damage sites created in the lower doped epitaxial layer 2. With the method of channelling of the crystal lattice damage will occur throughout the channelled range (see FIG. 1) in the lower doped region 2 below the opening 6. The energy is then reduced so as to effect damage and enhance diffusion in the part of the region 2 adjacent the surface 3.

The result of the enhanced impurity diffusion of boron from the $p^+$-substrate 1 into the lower doped n-type epitaxial layer 2 is the formation of a p-type region 8 in the epitaxial layer 2, the region 8 lying below and in registration with opening 6. In FIG. 2 the proton beam is indicated by reference numeral 9. The p-n junction part 10 is substantially normal to the surface 3.

This embodiment demonstrates the method of employing channelling protons having a controlled range to produce enhanced diffusion across only part of a boundary between a higher doped region and a lower doped region and to define a further region having a precisely defined substantially constant lateral extent. The method may be used in a similar manner for an epitaxial layer and substrate which are of the same conductivity type.

Referring now to FIG. 4, in this embodiment the semiconductor body comprises an n-type silicon substrate 11 of approximately 200 microns thickness and 0.01 ohm-cm resistivity having thereon an $n^-$-epitaxial layer 12 of 3 microns thickness and of 5 ohm-cm resistivity. The planes of the surface of the substrate 11 and of the surface 13 of the epitaxial layer lie normal to the <111> direction. In the surface of the substrate 11 there are a plurality of buried $p^+$-regions 14 which have been formed by diffusion of boron and have a diffused surface concentration of boron of approximately $5 \times 10^{20}$ atoms/cm$^3$, the buried regions 14 each extending to a depth of 0.5 micron in the substrate. The buried regions 14 each have a width in the section shown of 8 microns and are spaced by a distance of 3 microns. On the surface 13 of the epitaxial layer 12 there is shown a silicon oxide layer 16 having thereon a masking layer 17 of molybdenum of approximately 1 micron thickness. A plurality of openings 18 are formed in the molybdenum layer and in the underlying silicon oxide layer, these openings being of 5 microns width in the section shown and spaced by a distance of 6 microns. The openings lie symmetrically disposed over and in registration with the buried regions 14. By a similar method as described in the preceding embodiment the exposed surface portions of the body are subjected to a beam of incident protons. In this embodiment the proton beam 19 is aligned to the <111> direction, the energy is chosen such that the channelling proton range initially is approximately 3.2 microns and the temperature at which the body is heated during bombardment is 800°C. As in the preceding embodiment the area of damage caused by the channelled protons lies substantially in registration with the area of the openings and enhanced diffusion of boron from the $p^+$-buried layers 14 occurs into the damage sites in the overlying epitaxial layer portions to form p-type regions 20 the lateral extent of which is substantially constant.

FIG. 5 shows the further step where proceeding from the structure obtained and as shown in FIG. 4 a junction field effect transistor is formed. In this device a shallow high concentration diffusion of boron is made into the openings 18 to form a plurality of $p^+$-regions 22 so that the p-n junctions 21 between the p-type regions 20, 22 and the n-type epitaxial layer 12 terminate in the surface 13 below the silicon oxide layer 16. Openings are made in the silicon oxide layer 16 and a metal contact layer for example of a gold/antimony alloy, is deposited and defined by a photoprocessing and etching method to form a plurality of electrode areas 24 on the $p^+$-surface regions 22 and a plurality of electrode areas 25 on the intermediately situated surface portions of the n-type epitaxial layer. A metal layer 26 is also applied on the bottom surface of the substrate 11. In this junction field effect transistor structure current flow occurs in channel region portions formed by the n-type portions of the epitaxial layer 12 situated between the p-type regions 20 formed by the bombardment induced enhanced impurity diffusion from the buried $p^+$-regions 14. The electrode areas 24 are connected in common and together with the p-type regions 14, 20, 22 constitute the gate. The electrodes 25 are connected in common and constitute the drain electrodes, the source being constituted by the substrate 11 and electrode 26 thereon. The current flow in the channel portions is therefore across the epitaxial layer thickness and due to the substantially constant spacing of the p-type regions 20 the channel thickness is substantially constant. In this device the pinch off voltage is accurately determined due to the substantially constant channel thickness and also the resistance in series with the channel is small. If desired, to yield improved device characteristics more highly doped n-type surface regions may be incorporated below the drain electrodes 25.

Referring now to FIG. 6, this illustrates an embodiment of the method in which the incident beam is inclined to the surface of the lower doped region. In this particular embodiment the semiconductor body structure is similar to that shown in FIG. 4, corresponding parts being indicated with the same reference numerals, and has the same orientation of the surface 13. However the openings 18 in the molybdenum masking layer 17 and underlying silicon layer 16 are displaced with respect to the underlying $p^+$-buried regions 14. The exposed surface portions are subjected to bombardment with a proton beam which is aligned to the <110> direction and thus inclined at an angle of 35.27° to the normal to the surface. This proton bombardment, in which channelling of the protons occurs in the <110> direction, and simultaneous heating yields p-type regions 20 having inclined parallel sides but of substantially constant lateral extent.

Referring now to FIGS. 7 to 9, this embodiment concerns a further junction field effect transistor in which the controlled channelling of protons is used to determine the extent of channel region portions of substantially constant thickness. However this junction field effect transistor structure differs from that shown in FIG. 5 in that the current flow in channel portions of an epitaxial layer lies substantially parallel to the semiconductor body surface.

The semiconductor body comprises an n-type silicon substrate 31 of 200 microns thickness and of 10 ohm.cm resistivity. The surface of the substrate 31 is orientated normal to the <110> direction. On the substrate 31 there is an n-type silicon epitaxial layer 32 of either 2 ohm.cm or 10 ohm.cm resistivity according to the desired characteristics of the device as will be described in further detail hereinafter. The thickness of the epitaxial layer 32 is 3 microns. On the surface 33 of the epitaxial layer 32 there is a silicon oxide layer 34. At the interface between the substrate 31 and the epitaxial layer 32 there is a $p^+$-buried region 35 which extends into the substrate 0.5 micron and has been formed by diffusion of boron with a surface concentration of approximately $5 \times 10^{20}$ atoms/cm³. The p-n junction between the buried region 35 and the substrate 31 is indicated by reference numeral 36. Extending through the epitaxial layer 32 are p-type gate wall portions 38 formed by channelled proton bombardment induced enhanced impurity diffusion from parts of the $p^+$-buried layer 35 into the overlying n-type epitaxial layer 32. The width of the wall portions in the section of FIG. 8 is 3 microns and their spacing is also 3 microns. These wall portions consist of five centrally disposed portions of rectangular area and an outer rectangular strip portion. Adjacent the surface of the epitaxial layer there is a boron implanted $p^+$-layer 39 which connects the p-type gate wall portions 38 at the surface and overlies the n-type channel portions defined in the epitaxial layer by the gate wall portions. The $p^+$-layer 39 has two rectangular apertures situated on opposite sides of the five centrally disposed gate wall portions. The n-type channel portions 40 are thus buried in the epitaxial layer and surrounded on all sides by the composite p-type region formed by the buried layer 35, the gate wall portions 38 and the surface layer 39. The extremities of the p-type wall portions 38 between which the channel portions are defined are indicated in FIG. 7 by chain-dot-lines and the termination in the surface of the p-n junction between the $p^+$-layer 39 and the n-type epitaxial layer is indicated in FIG. 7 by the broken lines 37. Situated on opposite sides of the central area below which the buried channel portions are present and within the rectangular openings in the $p^+$-layer 39 there are rectangular $n^+$-source and drain electrode regions 41 and 42 formed by diffusion of phosphorus into the semiconductor epitaxial layer surface. Source and drain electrode metal layers 43 and 44 extend in openings in the insulating layer 34 in contact with the $n^+$-surface regions 41 and 42 respectively. A central rectangular gate electrode 45 extends on the insulating layer 34 and in further openings in the insulating layer 34 situated immediately above the p-type gate wall portions 38. In this device current flows between the source electrode region 41 and the drain electrode region 42 via the buried channel portions 40. The lateral extent of the portions 40 is substantially constant because the p-type gate wall portions which partly define the channel portions 40 have a substantially constant lateral dimension and separation. Due to this substantially constant thickness of the channel portions any variation of the pinch-off voltage for different parts of the structure may be relatively small. Current flow can be pinched-off from all sides in the portions 40 so that in the limiting case just before total-pinch off the current flows in a central area of very small cross section along the portions 40. This device is a high gain junction field effect transistor, it has a low gate capacitance compared with conventional planar junction field effect transistors formed by double diffusion methods. The device may be constructed by appropriate doping of the n-type epitaxial layer such that the depletion layer width of the junction with the gate region is (a) not sufficient to pinch-off the channel at zero gate bias or (b) is sufficient to pinch-off the channel at zero gate bias. The latter form is referred to as a normally-off junction field effect transistor and conduction is initiated by applying a forward bias between the gate and source. For channel regions of the stated dimensions an n-type epitaxial layer of 2 ohm.cm will yield a normally-on junction field effect transistor and an n-type epitaxial layer of 10 ohm.cm resistivity will yield a normally off junction field effect transistor.

The manufacture of the junction field effect transistor shown in FIGS. 7 to 9 will now be described as far as is relevant to the method in accordance with the invention. A rectangular $p^+$-buried layer 35 is formed by conventional planar diffusion methods in the surface of an n-type silicon substrate which is orientated normal to the <110> direction. The substrate is of 200 microns thickness and 10 ohm.cm resistivity. Thereafter by a conventional method an n-type epitaxial layer of appropriate resistivity as described above is provided on the substrate and a silicon oxide layer grown on the epitaxial layer surface. The diffused $n^+$-regions 41 and 42 are formed by a conventional planar diffusion method. A nichrome layer is then provided on the surface of the oxide layer on the epitaxial layer. Openings are then made in the nichrome layer, said openings lying above the $p^+$-buried layer 35 in areas at which the gate wall portions are to be formed. The openings comprise a peripheral rectangular strip of 3 microns width and five centrally disposed equidistant parallel strips of 3 microns width and spaced by a distance of 3 microns.

Using the remaining parts of the nichrome layer as a mask a proton bombardment step is then carried out with the proton beam normal to the surface of the epitaxial layer and thus aligned to the <110> direction. The conditions of proton bombardment are as described in the embodiment with respect to FIG. 4. The enhanced diffusion of the boron from parts of the buried layer 35 due to damage sites produced by the channelled protons in the overlying epitaxial layer forms the gate wall portions 38 having a substantially constant lateral dimension of approximately 3 microns.

A portion of the nichrome layer is then removed so that there remain two rectangular portions lying over and of slightly larger area than the $n^+$-regions 41 and 42 and an outer portion lying beyond the area of the $p^+$-buried layer 35. A boron implantation step is then made using the remaining portions of the nichrome layer as a mask. The remaining nichrome layer portions are then removed and a short annealing treatment is carried out at 900°C to form the $p^+$-surface layer 39. Openings are made in the surface oxide layer to expose the $n^+$-regions 41 and 42 and the portions of the $p^+$-surface layer 39 where said layer lies above the $p^+$-gate wall portion 38. An aluminum layer is then deposited over the whole surface and in said openings and further defined by a photoprocessing an etching method to form the source electrode 43, the drain electrode 44 and the gate electrode 45.

It will be appreciated that many modifications may be made within the scope of the invention. The method in accordance with the invention may be employed in the manufacture of devices other than field effect transistors, for example in bipolar transistors. In the latter devices having a conventional planar structure the profiling of the collector region impurity concentration directly under the emitter region may be achieved in a particular advantageous way by use of the method in accordance with the invention. The more highly doped profiled part of the collector region having a substantially constant lateral extent obtained by this controlled channelling method facilitates the use of a buried layer having desired lower impurity concentration and longer diffusion times than have been used hitherto for this profiling step.

The method in accordance with the invention may also be used in the manufacture of a lateral bipolar transistor to yield a device having a precisely controlled base width. This transistor structure may be obtained, for example, by first using double diffusion or ion implantation techniques to form in a substrate of one conductivity type first and second surface regions respectively of the opposite conductivity type and of the one conductivity type, the second region lying within the first region which in turn lies within the substrate. An epitaxial layer of the one conductivity type is then provided on the substrate to bury the first and second regions and thereafter a proton bombardment step with controlled channelling is employed to cause the enhanced diffusion of impurities in the first and second regions into the epitaxial layer and thus define a lateral transistor structure in which the base region formed by the enhanced diffusion of the impurity from the first region into the epitaxial layer has a substantially constant width.

In the junction field effect transistor structure shown in FIG. 5, the buried regions 14 and the proton bombardment may be arranged such that the p-type gate wall portions 20 define a plurality of totally enclosed n-type channel region portions which may be pinched-off from all sides, for example these channel region portions may be of circular section if when masking to define (a) the buried layers 14 and (b) the apertures in the layer 16, 17 for proton bombardment a mask comprising a plurality of circular openings is used. It will be evident that the channel region portions may be provided with other cross-sectional shapes, for example they may be triangular. In each case the choice of the particular shape will be to provide the desired device characteristics.

The method in accordance with the invention, in addition to being used in the manufacture of discrete circuit elements as described in the preceding embodiments, may also be used in the manufacture of semiconductor integrated circuits, particularly where it is desired to form a region of precisely controlled substantially constant lateral dimensions.

What we claim is:

1. In a method of manufacturing a semiconductor device wherein in a semiconductor body comprising a boundary between a higher doped region and a lower doped region radiation enhanced diffusion of impurity is effected across the boundary from the higher doped region into the lower doped region to form in the lower doped region a further region the lateral extent of which is substantially constant, said radiation enhanced diffusion being effected by directing a beam of energetic particles towards the boundary from the side thereof at which the lower doped region is present to produce damage of the crystal structure in the lower doped region at least in the vicinity of the boundary, the improvement comprising orienting the semiconductor body with respect to the incident beam and imparting energy to the beam particles in such manner as to produce channelling of the semiconductor body crystal lattice by the particles with a channelling range in the lower doped region which extends at least to but not substantially beyond the said boundary.

2. A method as claimed in claim 1 wherein the channelling of particles is effected to produce damage of the crystal structure throughout the length of the lower doped region traversed by said particles whereby the further region of substantially constant lateral dimensions formed by the enhanced diffusion extends between the boundary and a surface of the lower doped region remote from said boundary.

3. A method as claimed in claim 2, wherein the lower doped region extends to a surface of the semiconductor body remote from the boundary and the particles are incident on said surface.

4. A method as claimed in claim 3, wherein the particles are protons.

5. A method as claimed in claim 1, wherein the boundary substantially coincides with the interface between a substrate region of the body and an epitaxial layer thereon.

6. A method as claimed in claim 5, wherein the higher doped region consists of a buried layer extending into the substrate region from the surface thereof on which the epitaxial layer is present.

7. A method as claimed in claim 1, wherein the incident beam of particles is perpendicular to the surface of the lower doped region, the crystallographic orientation of the body being such as to yield channelling in this direction of the incident beam.

8. A method as claimed in claim 7, wherein the semiconductor body is of silicon and the surface of the lower doped region lies normal to the <111> direction, the particles being channelled in the <111> direction.

9. A method as claimed in claim 1, wherein the incident beam of particles is inclined to the surface of the lower doped region.

10. A method as claimed in claim 9, wherein the semiconductor body is of silicon and the surface of the lower doped region lies normal to the <111> direction, the particles being channelled in the <110> direction.

11. A method as claimed in claim 1 for the manufacture of a junction field effect transistor, wherein the enhanced impurity diffusion is effected to determine in an epitaxial layer of one conductivity type gate region wall portions of the opposite conductivity type formed by enhanced diffusion of impurity from one or more buried layers of higher doping and of the opposite conductivity type extending at the substrate surface, said gate region wall portions having a substantially constant separation and so determining a channel region of the one conductivity type in the epitaxial layer, said channel region being of substantially constant thickness.

12. A method as claimed in claim 11, wherein the substrate is of the one conductivity type and comprises a plurality of spaced highly doped buried regions of the opposite conductivity type, the current flow between source and drain electrodes on the channel region being in the direction across the epitaxial layer in a portion or portions of the epitaxial layer of substantially constant width determined by the gate wall portions formed in said layer by enhanced diffusion from the said buried regions.

13. A method as claimed in claim 11, wherein the substrate is of one conductivity type and comprises at the surface a single highly doped buried region of the opposite conductivity type, the current flow between source and drain electrodes on the channel region being in a direction substantially parallel to the surface of the epitaxial layer in portions of the epitaxial layer of substantially constant width determined by the gate wall portions formed in said layer by enhanced diffusion from spaced portions of the highly doped buried region.

14. A method as claimed in claim 13, wherein at the surface of the epitaxial layer there is a further layer of the opposite conductivity type which connects adjoining gate wall portions.

15. A semiconductor device manufactured in accordance with the method of claim 1.

* * * * *